United States Patent
Bosiers et al.

(10) Patent No.: US 6,639,259 B2
(45) Date of Patent: Oct. 28, 2003

(54) CHARGE-COUPLED DEVICE

(75) Inventors: Jan Theodoor Jozef Bosiers, Eindhoven (NL); Agnes Catharina Maria Kleimann, Eindhoven (NL); Yvonne Astrid Boersma, Nijmegen (NL)

(73) Assignee: Dalsa Corporation, Ontario (CA)

( * ) Notice: Subject to any disclaimer, the term of this patent is extended or adjusted under 35 U.S.C. 154(b) by 29 days.

(21) Appl. No.: 10/055,343

(22) Filed: Jan. 22, 2002

(65) Prior Publication Data

US 2002/0175350 A1 Nov. 28, 2002

(30) Foreign Application Priority Data

Jan. 23, 2001 (EP) .............................. 01200234

(51) Int. Cl.[7] .............................................. H01L 27/148
(52) U.S. Cl. ...................... 257/219; 257/221; 257/214; 257/215
(58) Field of Search .............................. 257/214, 215, 257/219, 221

(56) References Cited

U.S. PATENT DOCUMENTS 5,164,807 A   11/1992   Theuwissen ................ 257/241
5,578,511 A * 11/1996   Son
5,612,554 A    3/1997   Funakoshi ................... 257/215

FOREIGN PATENT DOCUMENTS

EP         0383210 A1     8/1990

* cited by examiner

*Primary Examiner*—Fetsum Abraham
(74) *Attorney, Agent, or Firm*—Dorsey & Whitney LLP

(57) ABSTRACT

The invention relates to a CCD of the buried-channel type comprising a charge-transport channel in the form of a zone (12) of the first conductivity type, for example the n-type, in a well (13) of the opposite conductivity type, in the example the p-type. In order to obtain a drift field in the channel below one or more gates (9, 10a) to improve the charge transfer, the well is provided with a doping profile, so that the average concentration decreases in the direction of charge transport. Such a profile can be formed by covering the area of the well during the well implantation with a mask, thereby causing fewer ions to be implanted below the gates (9, 10a) than below other parts of the channel. By virtue of the invention, it is possible to produce a gate (10a) combining a comparatively large length, for example in the output stage in front of the output gate (9) to obtain sufficient storage capacity, with a high transport rate.

10 Claims, 3 Drawing Sheets

CHARGE-COUPLED DEVICE

The invention relates to a charge-coupled device comprising a semiconductor body having a charge-transport channel, situated at a surface, in the form of a zone of a first conductivity type, which is provided in a well of the opposite, i.e. the second conductivity type, a row of electrodes in the form of conductor tracks being provided above the charge-transport channel, said conductor tracks being separated from the underlying semiconductor body by an intermediate dielectric layer, the row of electrodes comprising at least a first electrode and an adjacent second electrode which, viewed in the direction of the charge transport, is situated behind the first electrode. The invention also relates to a method of manufacturing a charge-coupled device, wherein masked doping is employed to provide a semiconductor body, at a surface, with a zone of a first conductivity type forming a charge-transport channel, and with a well of the opposite, i.e. the second conductivity type, which extends from the surface deeper into the semiconductor body than the zone and surrounds said zone inside the semiconductor body.

Charge-coupled devices belong to a generally known type of integrated circuits and are used on a large scale, for example as two-dimensional image sensors, in cameras to convert an electromagnetic radiation image into a series of electrical signals whose size is a measure of the local light intensity. The image sensor generally comprises a recording matrix having vertical charge-transport channels and a horizontal readout register whose output is connected to an output amplifier. In a known embodiment, the semiconductor body comprises an n-type substrate which is provided at the surface with a p-type well wherein the n-type charge-transport channels are formed.

Charge-coupled devices cannot only be used as image sensors but also to process signals. Consequently, although the invention is important to image sensors in particular, it is not limited thereto.

For a satisfactory operation of charge-coupled devices, it is important that electric charge can be rapidly transported, and substantially without leaving residual charge, from one charge-storage location to a next charge-storage location. This can be achieved by designing the device in such a manner that charge transport takes place under the influence of an electrical drift field. To this end, the length of the electrodes (i.e. the dimension of the electrodes viewed in a direction parallel to the transport direction) is often reduced to a minimum. However, this is not always possible. For example, in the case of an FD output (floating diffusion output), it must be possible to store the total charge below the electrode that was clocked last. This requirement imposes limitations on the minimum value of the effective surface area of the electrode that determines the charge-storage capacity. To increase the width of the electrode (i.e. the dimension transverse to the transport direction) it is necessary to increase the capacity of the floating output zone, which leads to a reduction of the sensitivity of the output. Increasing the length of the electrode has the disadvantage that electrical drift fields below the electrode, which lead to an increase of the charge transport rate, become weaker or disappear altogether, as a result of which a less efficient charge transport is obtained.

Apart from a small electrode length, also other ways, that are known per se, can be used to induce drift fields into the charge-transport channel. For example, in patent document U.S. Pat. No. 5,164,807 a description is given of an image sensor having three readout registers, wherein the transport between the registers is improved by embodying electrodes so as to be more or less conical in shape. However, such a solution is often impossible, for example in the above-described FD output. It has also been proposed to profile the doping concentration in the charge-transport channel in the transport direction. However, this requires additional process steps causing the manufacture to become more complex and hence more expensive.

It is an object of the invention to provide, inter alia, a method of forming drift fields in the charge-transport channel without additional process steps and/or without substantially changing the shape of the electrodes. The invention further aims at providing a method of manufacturing a charge-coupled device with an efficient, rapid charge transport.

A charge-coupled device of the type mentioned in the opening paragraph is characterized in accordance with the invention in that the average doping concentration of impurity atoms of the second conductivity type in the well is lower at the location of the second electrode than at the location of the first electrode. The invention is based on the recognition that a profiled doping profile in the well also enables the electrical field in the charge-transport channel to be influenced. As will become apparent from the description hereinbelow, a suitable doping profile in the well can be obtained in a simple manner without additional process steps.

A method of the type described in the opening paragraph is characterized in accordance with the invention in that in the doping step of the well, a mask is used which locally masks the surface at the location of the charge-transport channel already present or yet to be formed, as a result of which locally in the well, below the charge-transport channel, a lower doping concentration is obtained than in adjoining parts of the well.

Further embodiments are described in the dependent claims.

These and other aspects of the invention will be apparent from and elucidated with reference to the embodiments described hereinafter.

In the drawings:

FIG. 1 diagrammatically shows a charge-coupled image sensor in accordance with the invention;

Figure 1:
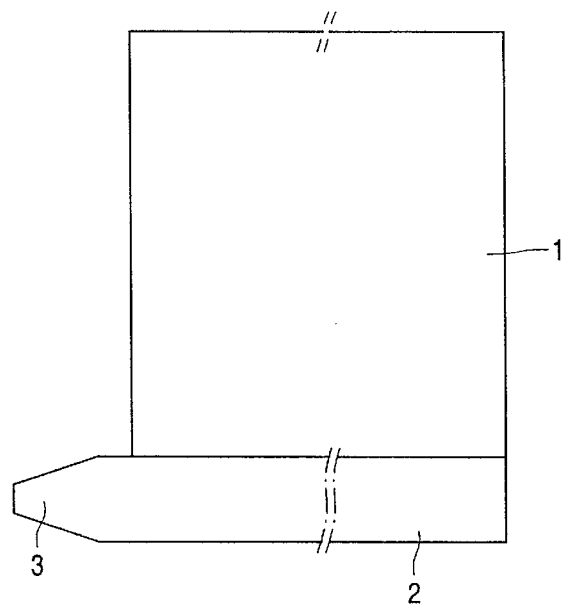

The image sensor shown in FIG. 1 comprises a matrix 1 enabling a two-dimensional image to be detected and converted to charge packets which are formed and stored in the matrix. After recording the image, these charge packets are transported via vertical CCD channels (not shown) to a horizontal register 2 in order to be read at the output 3 of this register. The image sensor may be of the so-called interline type wherein the photosensitive elements are formed by, for example, photodiodes arranged in columns and rows, and the vertical channels are arranged between the columns. Another type of image sensor, wherein the invention can also be advantageously applied, comprises a matrix 1 including only juxtaposed vertical channels, which are not only used to store and transport charge but also as photosensitive elements to convert light to electrical charge. Said device may be an image sensor of the Frame Transfer-type (FT type), wherein a part of the matrix 1 adjoining the output register is shielded from incident light and forms a memory section wherein an image (or a part thereof) recorded in the remaining, non-shielded part of the matrix 1 can be stored. In another embodiment, the entire matrix 1 is used to record an image.

If an image is recorded in the matrix 1, the lines are transported one by one in the horizontal register 2 and, subsequently, via the register 2 to the output 3 where the charge packets are read one by one. The length of the electrodes (not shown) of the register 2 must be adapted to the pitch of the matrix 1 and hence is generally small.

Figure 3:
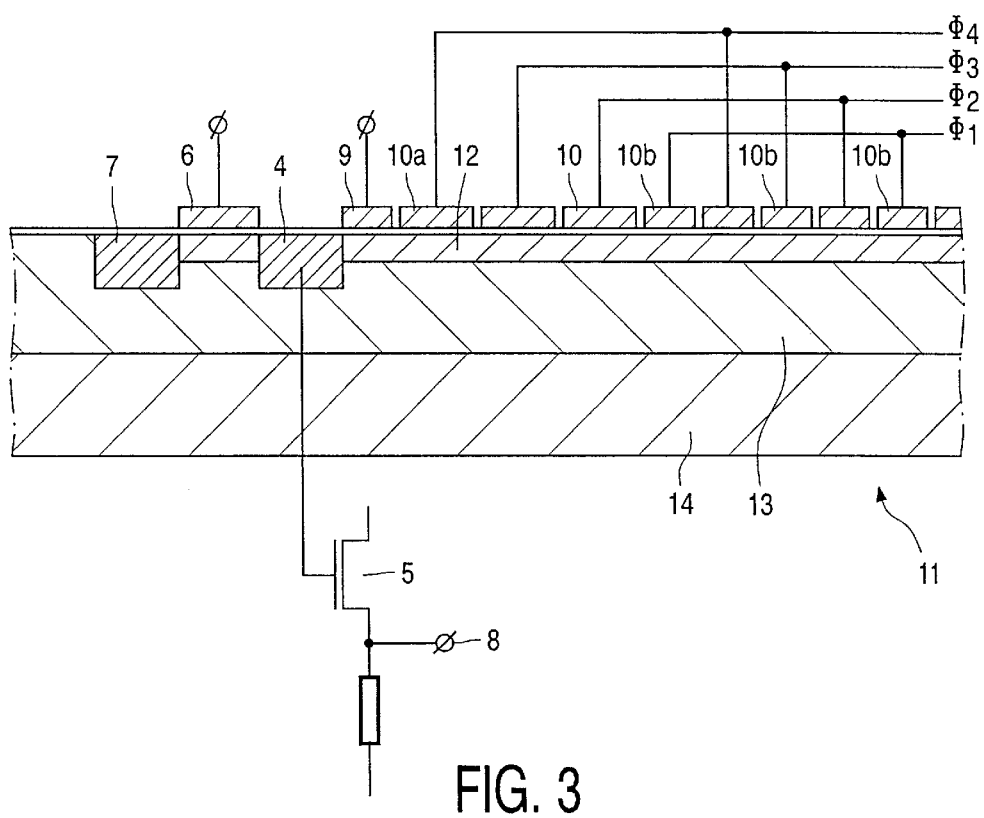
FIG. 3 is a sectional view of the output register of the charge-coupled image sensor shown in FIG. 1.
Figure 2:
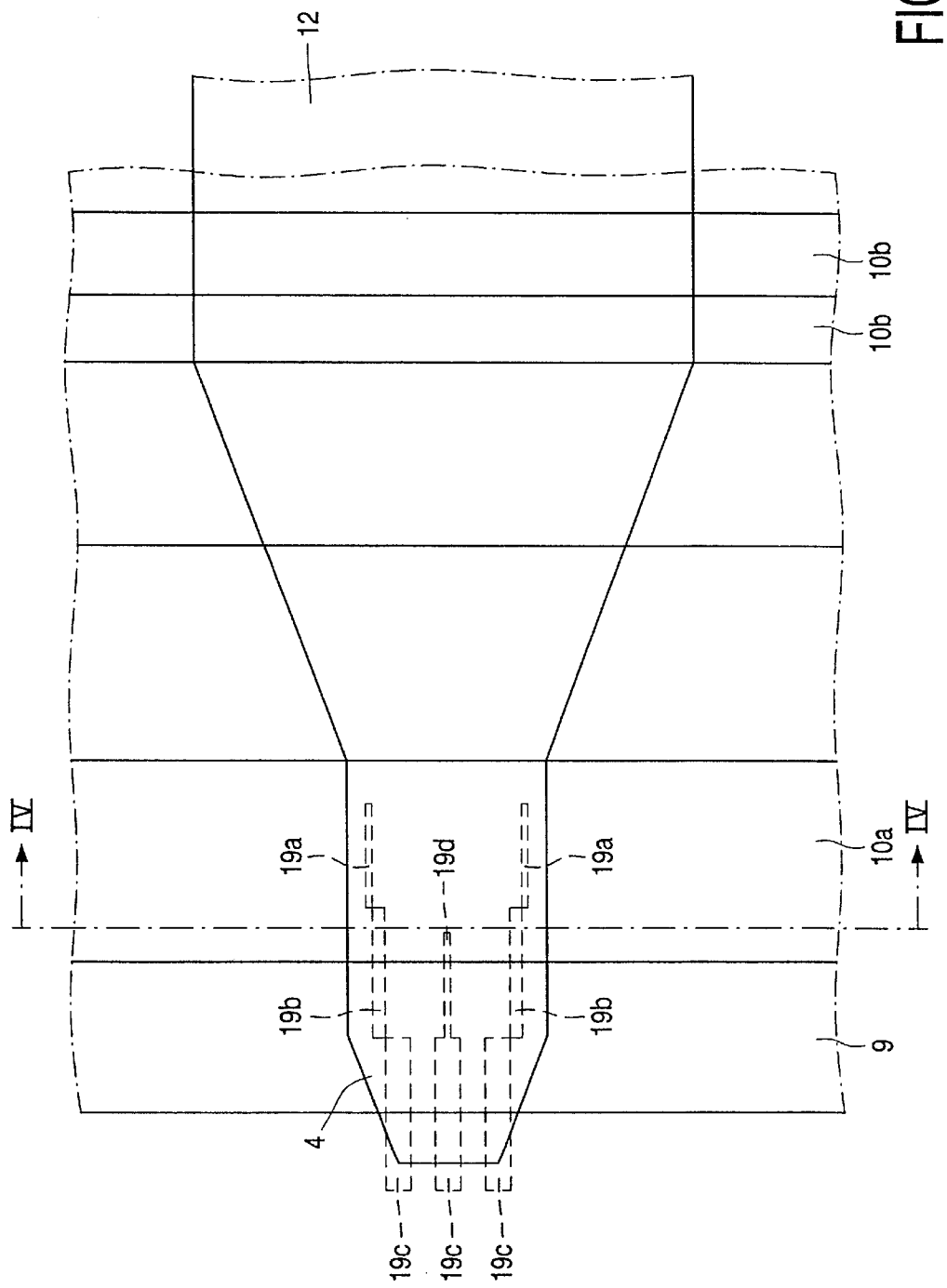
FIG. 2 is a diagrammatic plan view of the output of the output register of this image sensor.

At the location of the output 3 projecting beyond the matrix 1, this requirement does not apply, resulting in a greater freedom of design. As shown in FIG. 3, the output 3 comprises a heavily doped zone 4, which can be electrically insulated (floating zone) from the environment and is connected to the input of a source-follower circuit 5, a stage with output 8 of which is shown in the drawing but which may alternatively comprise a larger number of steps arranged in cascade. The zone 4 is further connected to a reset transistor having a reset gate 6 and a drain 7. During operation, a positive voltage (for example 20 V) is applied to the zone 4 via the reset transistor, after which the reset transistor is opened (rendered non-conducting), thereby causing zone 4 to become electrically floating. In this state, a charge packet can be stored in the floating zone 4, and the voltage change involved can be measured by the source follower 5. A high sensitivity (volt output signal per electron) requires the capacity of the zone 4 to be as small as possible. For this reason, as shown in FIG. 1 and FIG. 2, the channel is embodied so as to be tapered at the output 3.

The electrode 9, which is situated immediately in front of the output zone 4, forms the output gate that precludes crosstalk between the zone 4 and the clock voltages. A DC voltage is applied to the gate 9, which voltage is chosen to be such that the channel potential below the gate 9 has a value that ranges between the value of the channel potential below electrode 10a at a high voltage and the channel potential below electrode 10a at a low voltage. The other electrodes, bearing reference numeral 10, are connected to clock lines 11 via which clock voltages $\phi 1$–$\phi 4$ are applied. Obviously, it will be clear that the invention is not limited to 4-phase CCDs; it can also advantageously be applied in, for example, 2 or 3-phase devices.

The device comprises a semiconductor body 11 of silicon, which is provided at the surface with an n-type zone 12 that forms a buried CCD channel and is surrounded, inside the semiconductor body, by a p-type well 13 extending, inside the semiconductor body, from the surface to a greater depth in the semiconductor body 11 than the buried channel 12. On the side facing away from the surface, the p-well 13 borders on an n-type region 14 which, as is known, can be used as a drain for electrons, for example in the case of overexposure. Of course, the conductivity types can also be reversed, resulting in a p-channel CCD.

For the proper operation of the device, it is important that a charge packet of maximum size can be stored below the last clock electrode 10, bearing reference numeral 10a in the drawing, which is situated in front of the output gate 9. As the potential difference below the gates 9 and 10a is smaller than the potential difference caused in the channel by the high and the low voltage level of the clock voltage, electric charge stored below gate 10a will flow to the floating zone at a lower level than in the other parts of the channel. A maximum charge packet can be stored below the gate 10a by increasing the size of the (effective) surface area of this gate so as to be larger than the surface area of the preceding gates to which the same clock voltages are applied. Increasing the width of the gate (and of the underlying channel) generally leads to an increase of the capacity of the floating zone 4 and, hence, is not readily possible. Therefore, the storage capacity is increased, as is shown in the drawing, by increasing the length of gate 10a. In the drawing, see for example FIG. 3, this is shown by increasing the length of the electrode 10a so as to be larger than the length of the electrodes 10b, whose length is determined by the pitch in the matrix 1. In general, electrodes that are very long have weaker drift fields in the channel (or the drift fields are absent altogether) than electrodes having a smaller length, consequently a greater length of the electrode may adversely affect the charge transport. To preclude this, the average doping concentration in the p-well 13 below electrode 10 is chosen to be lower than the average doping concentration below the electrodes 10b. To obtain a drift field in the entire output stage 3 of the horizontal register, the doping concentration in the well is provided with a profile such that the average doping in the well decreases, in this example from electrode 10a to at least the heavily doped FD zone 4. As a result of this profile in the doping concentration in the p-well 13, a drift field is obtained below the electrodes 10a and 9, which has a favorable influence on the transport of electrons in the direction of electrode 10a to the FD zone 4.

Figure 4A:
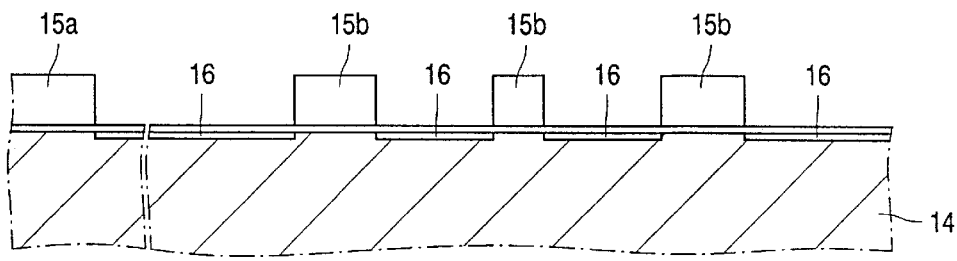
FIG. 4 is a sectional view of the image sensor, taken on the line IV—IV in FIG. 2, in two stages of the manufacturing process.
Figure 4B:
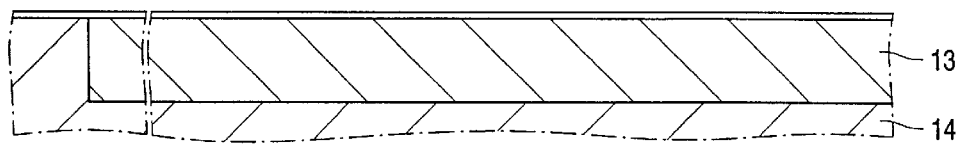
Figure 5:
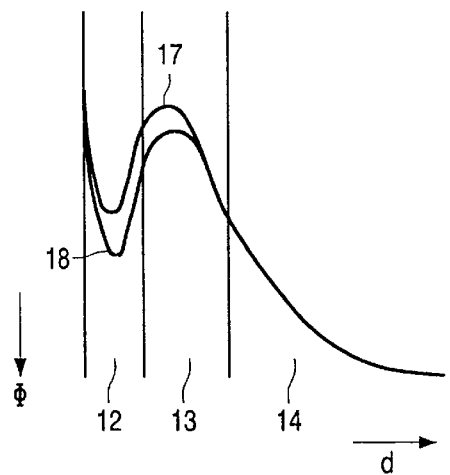
FIG. 5 is a potential diagram in a direction transverse to the surface at two doping concentrations in the p-well of this device.

The desired doping profile can be produced without additional process steps. For clarity, two stages in the manufacture of the image sensor are shown in FIG. 4. The drawing is a sectional view of the device taken on the line IV—IV in FIG. 2. There is started from an n-type doped semiconductor body in which the part that is not to be doped forms the drain region 14. The doping concentration of the region 14 is, for example, $5.10^{14}$ at/cm$^3$. On the surface of the semiconductor body, a mask 15 is formed, for example of a photoresist layer, which defines the area of the p-well to be formed. The mask 15 comprises a part, bearing reference numeral 15a in the drawing, which defines the edge of the p-well, and parts 15b, which are situated above the area of the output stage of the CCD-channel 13 to be formed at a later stage. The locations 19 where the mask 15b was situated are indicated by means of dashed lines in the plan view of FIG. 2. By means of ion implantation, boron-doped regions 16 are provided in the non-masked surface parts of the semiconductor body 14. The implantation is carried out, for example, at an energy of 180 keV and a dose of approximately $1 \times 10^{12}$ ions per cm$^2$. After the implantation, the mask 15 is removed and the implanted boron ions are diffused further in the region 14 by heating in order to form the p-well 13 (FIG. 4b). The depth of the p-well is, for example, 3 $\mu$m. In spite of the mask portions 15b, the diffusion causes the well 13 to be formed by a continuous p-type region 13 having an average doping concentration that is lower than it would be in the absence of the mask portions 15b. FIG. 5 shows the effect of the doping profile in the well 13 on the potential. In the drawing, the potential $\Phi$ is plotted in the vertical direction (downwards), while the horizontal axis represents the distance d to the surface. Lines 17 and 18 show, respectively, the potential distribution at a higher and a lower doping concentration in the p-well. The drawing shows that the potential in the CCD channel 12 becomes more positive (deeper potential well for electrons)

as the doping in the well 13 is lower. Thus, by providing the doping of the well with a profile in the lateral direction, a lateral electric field can be generated in the channel, which field has a favorable effect on the charge transport in the channel. As shown in FIG. 2, a doping profile is provided in the well below electrode 10a by a number of stepwise increases, in the drawing from right to left, of the part of the surface that is masked during the implantation of the well, as a result of which the concentration in the well decreases in the same direction.

In a practical embodiment, the width of the channel 12 at the location of the electrodes 10b was approximately 15 μm. Beyond the electrodes 10b, the channel narrowed to a width of approximately 6 μm below the electrodes 10a, and beyond the output gate 9 it narrowed further to a width of approximately 3 μm. The (effective) width of the electrodes 10b was approximately 1.0 μm and the (effective) width of the electrode 10a was approximately 5 μm. Viewed from right to left, the comparatively narrow regions 19a having a width of approximately 0.5 μm are encountered first, which regions were masked during the implantation of the p-well 13, and past the middle of electrode 10a slightly wider regions 10b having a width of approximately 0.75 μm are subsequently encountered, as well as a 0.5 μm wide region 19d in the center of the channel. The regions 19b and 19d extend below part of the output electrode 9 where they merge into the approximately 1 μm wide regions 19c. The length of the electrode 10a was approximately 5 μm, yielding a large enough capacity to store a charge packet of maximum size below this electrode, while the doping profile obtained in the p-well generated a drift field that is sufficient to provide rapid and efficient charge transport.

Figure 6:
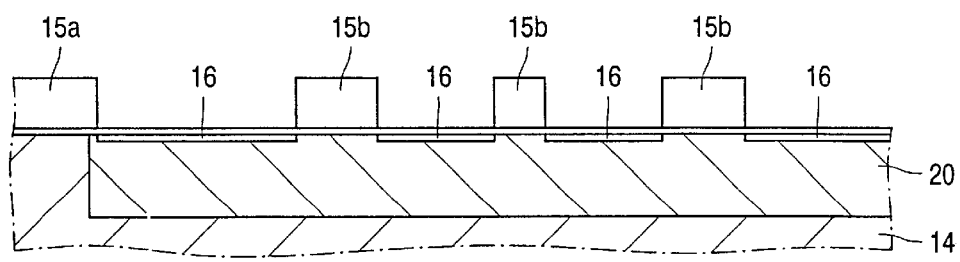
FIG. 6 is a sectional view of another embodiment of a device in accordance with the invention during the manufacturing process.

In the example described herein, the p-well 13 is produced by means of a single implantation that is used for the horizontal register 2 as well as for the recording section 1. It may be advantageous to provide the well in two implantation steps to obtain different doping profiles in the recording section 1 and the readout register 2, which doping profiles are adapted to the different requirements to be imposed on these sections. FIG. 6 is a sectional view, corresponding to the sectional view shown in FIG. 4a, of such an embodiment during the manufacture thereof. The drawing shows the device in a stage where the n-type substrate 14 is provided with a p-well 20 at the location of the recording section 1 and the output register 2. The well 20 is provided by implantation using a comparatively low dose of, for example, a few times $10^{11}$ at/cm$^2$, which is a favorable value for the recording section 1. Subsequently, the mask 15 is provided which masks the entire recording section 1 and which comprises, above the output stage of the output register 2 to be formed, the pattern 15a, 15b corresponding to the mask 15a, 15b in FIG. 4a. Next, by means of implantation, the concentration throughout the surface area of the output register is increased, with the exception of the masked portions, as a result of which the zones 16 are formed in the output portion. After removal of the mask 15, heating causes the boron atoms to be further diffused from the zones 16 into the semiconductor body so as to obtain the p-well 13 at the location of the output register.

It will be obvious that the invention is not limited to the examples given hereinabove, and that, within the scope of the invention, many variations are possible to those skilled in the art. For example, in the last example, it is possible to implant the zones 16 before the p-well 20. Instead of a stepwise increase of the width of the regions 19, masked regions 19 having a gradually increasing width (in the charge transport direction) can be formed.

What is claimed is:

1. A charge-coupled device comprising a semiconductor body (11) having a charge-transport channel, situated at a surface, in the form of a zone (12) of a first conductivity type, which is provided in a well (13) of the opposite, i.e. the second conductivity type, a row of electrodes (9, 10) in the form of conductor tracks being provided above the charge-transport channel, said conductor tracks being separated from the underlying semiconductor body by an intermediate dielectric layer, the row of electrodes comprising at least a first electrode (10b) and an adjacent second electrode (10a) which, viewed in the direction of the charge transport, is situated behind the first electrode, characterized in that the average doping concentration of impurity atoms of the second conductivity type in the well is lower at the location of the second electrode than at the location of the first electrode.

2. A charge-coupled device as claimed in claim 1, characterized in that the second electrode, viewed in a direction parallel to the charge transport direction, has a dimension (hereinafter referred to as length) that is larger than the length of the first electrode.

3. A charge-coupled device as claimed in claim 1, characterized in that the average doping concentration in the well below the second electrode has a decreasing profile in the charge transport direction.

4. A charge-coupled device as claimed claim 1, characterized in that the second electrode is separated by an intermediate output electrode from a floating zone (4) of an output stage having an amplifier circuit coupled to the floating zone that is also connected to a reset transistor.

5. A charge-coupled device as claimed in claim 4, characterized in that the average doping concentration in the well below the output electrode is lower than below the first electrode.

6. A charge-coupled device as claimed in claim 5, characterized in that the average doping concentration in the well below the output electrode is lower than below the second electrode.

7. A charge-coupled device as claimed in claim 4, characterized in that, at the location of the floating zone, the charge-transport channel is narrower than at the location of the first electrode.

8. A charge-coupled device as claimed in claim 1, characterized in that the semiconductor body is of the first conductivity type and separated, by the well of the second conductivity type, from the charge-transport channel of the first conductivity type.

9. A charge-coupled device as claimed in claim 8, characterized in that the charge-transport channel forms a read-out register of an image sensor for converting incident light into electrical signals.

10. A method of manufacturing a charge-coupled device, wherein masked doping is employed to provide a semiconductor body, at a surface, with a zone of a first conductivity type forming a charge-transport channel, and with a well of the opposite, i.e. the second conductivity type, which extends from the surface deeper into the semiconductor body than the zone and surrounds said zone inside the semiconductor body, characterized in that in the doping step of the well, a mask is used which locally masks the surface at the location of the charge-transport channel already present or yet to be formed, as a result of which locally in the well, below the charge-transport channel, a lower doping concentration is obtained than in adjoining parts of the well.

* * * * *